US012685024B2

(12) United States Patent
Kuroda et al.

(10) Patent No.: US 12,685,024 B2
(45) Date of Patent: Jul. 14, 2026

(54) PIEZOELECTRIC STACK, PIEZOELECTRIC ELEMENT, AND METHOD OF MANUFACTURING PIEZOELECTRIC STACK

(71) Applicant: SUMITOMO CHEMICAL COMPANY, LIMITED, Tokyo (JP)

(72) Inventors: Toshiaki Kuroda, Hitachi (JP); Kenji Shibata, Hitachi (JP); Kazutoshi Watanabe, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 870 days.

(21) Appl. No.: 18/012,920

(22) PCT Filed: Mar. 16, 2021

(86) PCT No.: PCT/JP2021/010500
§ 371 (c)(1),
(2) Date: Dec. 24, 2022

(87) PCT Pub. No.: WO2022/004068
PCT Pub. Date: Jan. 6, 2022

(65) Prior Publication Data
US 2023/0270013 A1      Aug. 24, 2023

(30) Foreign Application Priority Data
Jun. 30, 2020      (JP) ................................. 2020-112459

(51) Int. Cl.
*H10N 30/079*      (2023.01)
*C01G 9/03*      (2006.01)
(Continued)

(52) U.S. Cl.
CPC ........... *H10N 30/8542* (2023.02); *C01G 9/03* (2013.01); *C01G 33/006* (2013.01);
(Continued)

(58) Field of Classification Search
CPC ... C23C 14/025; C23C 14/083; C23C 14/086; C23C 14/088; H10N 30/05;
(Continued)

(56) References Cited

U.S. PATENT DOCUMENTS

| 9,136,820 B2 | 9/2015 | Aida et al. |
| 10,472,250 B2 | 11/2019 | Oishi et al. |

(Continued)

FOREIGN PATENT DOCUMENTS

| JP | 2007-184513 A | 7/2007 |
| JP | 2008-159807 A | 7/2008 |

(Continued)

OTHER PUBLICATIONS

PCT International Preliminary Report on Patentability, dated Dec. 13, 2022, which includes a Translation of International Searching Authority, "Written Opinion," issued in connection with International Patent Application No. PCT/JP2021/010500, dated Jun. 15, 2021.

(Continued)

*Primary Examiner* — Levi Gannon
(74) *Attorney, Agent, or Firm* — Foley & Lardner LLP

(57) ABSTRACT

There is provided a piezoelectric stack, including: a substrate; an oxide film on the substrate, containing zinc and oxygen as main elements; an electrode film on the oxide film; and a piezoelectric film on the electrode film, being an alkali niobium oxide film containing potassium, sodium, niobium, and oxygen and having a perovskite structure.

20 Claims, 2 Drawing Sheets

(51) Int. Cl.

| | |
|---|---|
| *C01G 33/00* | (2006.01) |
| *C23C 14/02* | (2006.01) |
| *C23C 14/08* | (2006.01) |
| *C23C 14/16* | (2006.01) |
| *C23C 14/35* | (2006.01) |
| *H10N 30/00* | (2023.01) |
| *H10N 30/076* | (2023.01) |
| *H10N 30/50* | (2023.01) |
| *H10N 30/853* | (2023.01) |

(52) U.S. Cl.
CPC .......... *C23C 14/025* (2013.01); *C23C 14/083* (2013.01); *C23C 14/086* (2013.01); *C23C 14/165* (2013.01); *C23C 14/35* (2013.01); *H10N 30/076* (2023.02); *H10N 30/079* (2023.02); *H10N 30/50* (2023.02); *H10N 30/708* (2024.05); *H10N 30/853* (2023.02); *C01P 2002/34* (2013.01); *C01P 2002/50* (2013.01); *C01P 2006/40* (2013.01)

(58) Field of Classification Search
CPC .... H10N 30/079; H10N 30/50; H10N 30/704; H10N 30/706; H10N 30/708; H10N 30/85; H10N 30/852; H10N 30/853; H10N 30/8542; H10N 30/877; H10N 30/878
See application file for complete search history.

(56) References Cited

U.S. PATENT DOCUMENTS

| | | | | |
|---|---|---|---|---|
| 2005/0140743 | A1* | 6/2005 | Miyazawa | .......... B41J 2/14233 347/68 |
| 2006/0138906 | A1* | 6/2006 | Iwashita | ............. B41J 2/14233 310/358 |
| 2007/0126313 | A1 | 6/2007 | Ueno et al. | |
| 2008/0067898 | A1* | 3/2008 | Aoki | ..................... H02N 2/106 347/68 |
| 2009/0236944 | A1 | 9/2009 | Shibata et al. | |
| 2018/0138393 | A1* | 5/2018 | Sumi | ................... H10N 30/877 |
| 2018/0159019 | A1 | 6/2018 | Nanao et al. | |
| 2018/0301618 | A1 | 10/2018 | Shibata et al. | |
| 2020/0161533 | A1 | 5/2020 | Shibata et al. | |
| 2020/0388746 | A1 | 12/2020 | Shibata et al. | |

FOREIGN PATENT DOCUMENTS

| | | |
|---|---|---|
| JP | 2015-530728 A | 10/2015 |
| JP | 2017-076730 A | 4/2017 |
| JP | 2018-093145 A | 6/2018 |
| JP | 2018-207055 A | 12/2018 |

OTHER PUBLICATIONS

International Searching Authority, "International Search Report," issued in connection with International Patent Application No. PCT/JP2021/010500, dated Jun. 15, 2021.
International Searching Authority, "Written Opinion," issued in connection with International Patent Application No. PCT/JP2021/010500, dated Jun. 15, 2021.

\* cited by examiner

PIEZOELECTRIC STACK, PIEZOELECTRIC ELEMENT, AND METHOD OF MANUFACTURING PIEZOELECTRIC STACK

CROSS-REFERENCE TO RELATED APPLICATIONS

The present application claims priority under 35 U.S.C. § 371 to International Patent Application No. PCT/JP2021/010500, filed Mar. 16, 2021, which claims priority to and the benefit of Japanese Patent Application No. 2020-112459, filed on Jun. 30, 2020. The contents of these applications are hereby incorporated by reference in their entireties.

TECHNICAL FIELD

The present disclosure relates to a piezoelectric stack, a piezoelectric element, and a method of manufacturing a piezoelectric stack.

DESCRIPTION OF RELATED ART

Piezoelectric materials are widely used in functional electronic components such as sensors and actuators. Widely used piezoelectric materials include lead-based materials, in particular, a PZT-based ferroelectric represented by a composition formula of $Pb(Zr_{1-x}Ti_x)O_3$. PZT-based piezoelectric materials contain lead, and thus are not preferable due to concerns about its influence on the human body and the like. Therefore, piezoelectric materials containing potassium, sodium, niobium, and oxygen is proposed as piezoelectric materials not containing lead, and a stack having a piezoelectric film deposited using such a piezoelectric material is proposed (see, e.g., Patent Documents 1 and 2).

PRIOR ART DOCUMENT

Patent Document

Patent Document 1: Japanese Patent Laid Open Publication No. 2007-184513
Patent Document 2: Japanese Patent Laid Open Publication No. 2008-159807

SUMMARY

Problem to be Solved by Disclosure

In the techniques disclosed in the above Patent Documents, it was found that, when an electric field is applied in a thickness direction of the piezoelectric film, dielectric breakdown is more likely to occur in a case where the electric field is applied toward one side in the thickness direction than in a case where the electric field is applied toward the other side in the thickness direction. That is, it was found that a breakdown voltage of the piezoelectric film sometimes varies depending on a direction of the electric field applied. This is a new problem that became clear for the first time as a result of intensive studies by the inventors.

Also, in the techniques disclosed in the above Patent Documents, there is a problem that, when a deposition temperature of the piezoelectric film is lowered in order to reduce a dielectric constant of the piezoelectric film, a crystal orientation of the piezoelectric film deteriorate.

An object of the present disclosure is to further improve a performance of a piezoelectric film containing potassium, sodium, niobium, and oxygen.

Means for Solving Problem

According to an aspect of the present disclosure, there is provided a piezoelectric stack and its related techniques, including:
  a substrate;
  an oxide film on the substrate, containing zinc and oxygen as main elements;
  an electrode film on the oxide film; and
  a piezoelectric film on the electrode film, being an alkali niobium oxide film containing potassium, sodium, niobium, and oxygen and having a perovskite structure.

Advantage of Disclosure

According to the present disclosure, a performance of a piezoelectric film containing potassium, sodium, niobium, and oxygen can be further improved.

DETAILED DESCRIPTION OF THE DISCLOSURE

Findings Obtained by the Inventors

Figure 1:
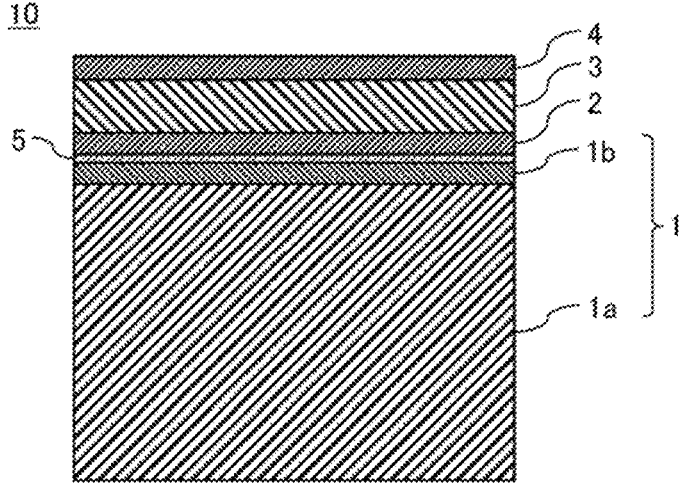
FIG. 1 is a view illustrating an example of a cross-sectional structure of a piezoelectric stack according to an aspect of the present disclosure.

In a stack having a substrate, a bottom electrode film deposited on the substrate, a piezoelectric film (KNN-film) deposited on the bottom electrode film and containing potassium (K), sodium (Na), niobium (Nb), and oxygen (O), and a top electrode film deposited on the KNN-film, a film containing titanium (Ti) (e.g., Ti-film) is generally provided between the substrate and the bottom electrode film as an adhesion film that brings them into tight contact with each other. It was found that a piezoelectric element (piezoelectric device module) produced using the stack provided with such an adhesion film is more likely to undergo dielectric breakdown during a positive voltage application than during a negative voltage application. The term "a negative voltage application" in this specification indicates that a negative voltage is applied to the top electrode film such that an electric field is generated upward (direction from the bottom electrode film toward the top electrode film) in a thickness direction of the KNN-film, between the top electrode film and the bottom electrode film, when a top electrode film side is a negative side and a bottom electrode film side is grounded. The term "a positive voltage application" in this specification indicates that a positive voltage is applied to the top electrode film such that an electric field is generated downward (direction from the top electrode film toward the bottom electrode film) in the thickness direction of the KNN-film, between the top electrode film and the bottom electrode film, when the top electrode film side is a positive side and the bottom electrode film side is grounded.

The inventors intensively studied on the above problem. As a result, the inventors obtains findings as follows: Ti in the adhesion film passes through the bottom electrode film and diffuses to the KNN-film in some cases, and this might be a factor that causes a dielectric breakdown during a positive voltage application. This is because Ti easily diffuses to a top surface of the bottom electrode film (a surface which is in contact with the KNN-film) in a temperature environment during a deposition of the KNN-film, for example. Therefore, when a film containing Ti is provided as the adhesion film, Ti in the adhesion film diffuses to the piezoelectric film and binds to oxygen in the piezoelectric film (captures oxygen in the piezoelectric film), resulting in $TiO_x$. As a result, an oxygen defect (oxygen deficiency, oxygen vacancy) occurs in the piezoelectric film, in particular, near an interface between the piezoelectric film and the bottom electrode film. When a positive voltage is applied in the piezoelectric element (piezoelectric device module) having such a piezoelectric film, the oxygen defects in the piezoelectric film move in the piezoelectric film toward the bottom electrode film side, and thus the dielectric breakdown occurs.

Also, in the stack provided with the Ti-film as the adhesion film, attempts have been made to further lower a deposition temperature of the piezoelectric film in order to further reduce a dielectric constant of the piezoelectric film. However, there also is a problem that, when the deposition temperature of the piezoelectric film is lowered, a crystal orientation of the piezoelectric film deteriorates. Thus, when the Ti-film is provided as the adhesion film, the piezoelectric film needs to be deposited at a high temperature (e.g., more than 500° C.) in order to avoid a deterioration in the orientation of the piezoelectric film, and as a result, the dielectric constant of the piezoelectric film cannot be sufficiently reduced. That is, a piezoelectric stack having both a high orientation and a low dielectric constant cannot be obtained.

The present disclosure is based on the above findings and the above problems obtained by the inventors.

Aspects of the Present Disclosure

An aspect of the present disclosure will be described hereinafter, with reference to the drawings.

(1) Configuration of Piezoelectric Stack

As illustrated in FIG. 1, a stack (stacked substrate) 10 (hereinafter also referred to as a piezoelectric stack 10) having a piezoelectric film according to the present embodiment includes a substrate 1, an oxide film 5 deposited on the substrate 1, a bottom electrode film 2 deposited on the oxide film 5, the piezoelectric film (piezoelectric thin film) 3 deposited on the bottom electrode film 2, and a top electrode film 4 deposited on the piezoelectric film 3.

Figure 2:
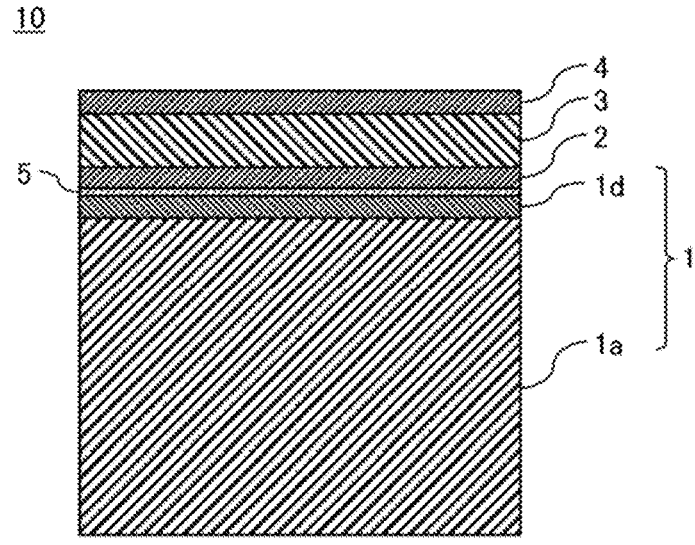
FIG. 2 is a view illustrating a modified example of the cross-sectional structure of the piezoelectric stack according to an aspect of the present disclosure.

The substrate 1 can suitably be a single-crystal silicon (Si) substrate 1a on which a surface oxide film ($SiO_2$-film) 1b such as a thermal oxide film or a CVD (Chemical Vapor Deposition) oxide film is formed, i.e., a Si-substrate having the surface oxide film. Alternatively, the substrate 1 can be a Si-substrate 1a having an insulating film 1d formed on a surface thereof, the insulating film 1d containing an insulating material other than $SiO_2$, as illustrated in FIG. 2. Alternatively, the substrate 1 can be the Si-substrate 1a in which Si-(100), Si-(111), or the like, is exposed on the surface thereof, i.e., a Si-substrate not having the surface oxide film 1b or the insulating film 1d. Alternatively, the substrate 1 can be an SOI (Silicon-On-Insulator) substrate, a quartz glass ($SiO_2$) substrate, a gallium arsenide (GaAs) substrate, a sapphire ($Al_2O_3$) substrate, or a metal substrate containing a metallic material such as stainless steel (SUS). A thickness of the single-crystal Si-substrate 1a can be, for example, 300 μm or more and 1000 μm or less, and a thickness of the surface oxide film 1b can be, for example, 1 nm or more and 4000 nm or less.

The oxide film 5 is a film containing zinc and oxygen as main elements. The oxide film 5 can be deposited using, for example, zinc oxide. The oxide film 5 is a polycrystalline film or a single-crystal film (hereinafter the oxide film 5 is also referred to as a ZnO-film 5). A composition ratio of Zn and O constituting the ZnO-film 5 preferably satisfies a relationship of Zn:O=1:1, but is not limited thereto and may vary slightly. Preferably, crystals constituting the ZnO-film 5 are mostly crystals whose (0001) is parallel to a main surface of the substrate 1 (including crystals in which (0001) is inclined at an angle of ±5 degrees or less with respect to the main surface of the substrate 1), i.e., the crystals constituting the ZnO-film 5 are preferentially oriented in (0001) direction. The term "crystals constituting the ZnO-film 5 are preferentially oriented in (0001) direction" indicates that, in an X-ray diffraction pattern obtained by X-ray diffraction (XRD) measurement, a diffraction peak due to crystals oriented in (0002) direction is the highest. That is, a surface of the ZnO-film 5 (a surface to be a base of the bottom electrode film 2) is preferably mainly constituted of ZnO-(0001). The ZnO-film 5 can be deposited using a method such as a sputtering method or an evaporation method. The ZnO-film 5 functions as an adhesion film that enhances an adhesiveness between the substrate 1 and the later-described bottom electrode film 2.

A thickness of the ZnO-film 5 can be, for example, 1 nm or more, and preferably 2 nm or more. Since the thickness of the ZnO-film 5 is, for example, 1 nm or more, the ZnO-film 5 can reliably function as the above adhesion film, and since the thickness of the ZnO-film 5 is 2 nm or more, the ZnO-film 5 can more reliably function as the above adhesion film. Also, an orientation of the later-described KNN-film 3 can be reliably improved. An upper limit of the thickness of the ZnO-film 5 is not particularly limited, but the thickness of the ZnO-film 5 can be, for example, 50 nm or less, preferably 20 nm or less, and more preferably 10 nm or less from a viewpoint of suppressing a decrease in a productivity of the piezoelectric stack 10.

The bottom electrode film 2 can be deposited using platinum (Pt), for example. The bottom electrode film 2 is a polycrystalline film or a single-crystal film (hereinafter collectively also referred to as a Pt-film). Preferably, crystals constituting the Pt-film are mostly crystals whose (111) is parallel to the main surface of the substrate 1 (including crystals in which (111) is inclined at an angle of ±5 degrees or less with respect to the main surface of the substrate 1), i.e., the crystals constituting the Pt-film are preferentially oriented in (111) direction. The term "crystals constituting the Pt-film are preferentially oriented in (111) direction" indicates that, in an X-ray diffraction pattern obtained by XRD measurement, a diffraction peak due to the crystals oriented in (111) direction is the highest. That is, a surface of the bottom electrode film 2 (a surface to be a base of the piezoelectric film 3) is preferably mainly constituted of Pt-(111). The bottom electrode film 2 can be deposited using a method such as a sputtering method or an evaporation method. For example, the bottom electrode film 2 whose surface is mainly constituted of Pt-(111) can be easily obtained by depositing the bottom electrode film 2 (the Pt-film) directly on the ZnO-film 5 whose surface is mainly constituted of ZnO-(0001). The bottom electrode film 2 can also be deposited using, in place of Pt, various metals such as gold (Au), ruthenium (Ru), or iridium (Ir); alloy containing the above various metals as main components. A thickness of the bottom electrode film 2 can be, for example, 100 nm or more and 400 nm or less.

The piezoelectric film 3 is an alkali niobium oxide film containing, for example, potassium (K), sodium (Na), niobium (Nb), and oxide (O). The piezoelectric film 3 can be deposited using potassium sodium niobium oxide (KNN). The piezoelectric film 3 is a polycrystalline film of KNN (hereinafter also referred to as a KNN-film 3). A crystal structure of KNN is a perovskite structure, i.e., the KNN-film 3 has a perovskite structure. The KNN-film 3 can be deposited using a method such as a sputtering method, a PLD (Pulsed Laser Deposition) method, or a sol-gel method. A thickness of the KNN-film 3 can be, for example, 0.5 μm or more and 5 μm or less.

Preferably, crystals constituting the KNN-film 3 are preferentially oriented in (001) direction with respect to the main surface of the substrate 1 (the Si-substrate 1a, in a case where the substrate 1 is, for example, the Si-substrate 1a having the surface oxide film 1b, the insulating film 1d, or the like). That is, a surface of the KNN-film 3 (a surface to be a base of the top electrode film 4) is preferably mainly constituted of KNN-(001). For example, the KNN-film 3 whose surface is mainly constituted of KNN-(001) can be easily obtained by depositing the KNN-film 3 directly on the Pt-film (the bottom electrode film 2) whose surface is mainly constituted of Pt-(111).

The term "crystals constituting the KNN-film 3 are oriented in (001) direction" in this specification indicates that (001) of the crystals constituting the KNN-film 3 is parallel to the main surface of the substrate 1. The term "(001) of the crystals constituting the KNN-film 3 is parallel to the main surface of the substrate 1" includes a case where (001) is completely parallel to the main surface of the substrate 1, and also a case where (001) is inclined within ±5 degrees, and preferably within ±3 degrees with respect to the main surface of the substrate 1. Also, the term "crystals constituting the KNN-film 3 are preferentially oriented in (001) direction" indicates that the crystals constituting the KNN-film 3 are mostly crystals whose (001) is parallel to the main surface of the substrate 1. For example, 80% or more crystals in a crystal group constituting the KNN-film 3 are preferably oriented in (001) direction with respect to the main surface of the substrate 1. That is, a (001) orientation ratio of the crystals constituting the KNN-film 3 (hereinafter also referred to as an "orientation ratio of the KNN-film 3") is preferably, for example, 80% or more, and more preferably, for example, 90% or more. The term "orientation ratio" in this specification is a value calculated using the following (Math. 1) based on a peak intensity in an X-ray diffraction pattern (2θ/θ) obtained by X-ray diffraction (XRD) measurement on the KNN-film 3.

$$\text{Orientation Ratio (\%)} = \{\text{intensity of (001) diffraction peak/(intensity of (001) diffraction peak+intensity of (110) diffraction peak)}\} \times 100 \quad \text{(Math. 1)}$$

The term "(001) diffraction peak" in the above (Math. 1) and in this specification is a diffraction peak due to crystals oriented in (001) direction (i.e., crystals whose (001) is parallel to the main surface of the substrate 1), out of the crystals constituting the KNN-film 3, in an X-ray diffraction pattern obtained by XRD measurement on the KNN-film 3, and is a peak which appears in a range that 2θ is 20 degrees or more and 23 degrees or less. The term "(110) diffraction peak" in the above (Math. 1) and in this specification is a diffraction peak due to crystals oriented in (110) direction (i.e., crystals whose (110) is parallel to the main surface of the substrate 1), out of the crystals constituting the KNN-film 3, in the X-ray diffraction pattern obtained by XRD measurement on the KNN-film 3, and is a peak that appears within a range in which 2θ is 30 degrees or more and 33 degrees or less.

Half or more crystals in the crystal group constituting the KNN-film 3 preferably have a columnar structure. Boundaries between the crystals constituting the KNN-film 3, i.e., crystal grain boundaries present in the KNN-film 3 preferably penetrate the KNN-film 3 in the thickness direction of the KNN-film 3. For example, the KNN-film 3 preferably has more crystal grain boundaries that penetrate the KNN-film 3 in the thickness direction than crystal grain boundaries that do not penetrate the KNN-film 3 in the thickness direction.

The KNN-film 3 may also contain elements other than K, Na, Nb, and O, such as copper (Cu), manganese (Mn), lithium (Li), tantalum (Ta), and antimony (Sb), in a range of, for example, 5 at % or less (in a case where a plurality of the above elements are added, a total concentration thereof is 5 at % or less).

The top electrode film 4 can be deposited using, for example, various metals such as Pt, Au, aluminum (Al), or Cu; or an alloy containing these metals. The top electrode film 4 can be deposited using a method such as a sputtering method, an evaporation method, a plating method, or a metal paste method. The top electrode film 4 does not greatly affect the crystal structure of the KNN-film 3, unlike the bottom electrode film 2. Therefore, there are no particular limitations on a material and a crystal structure, and a deposition method of the top electrode film 4. An adhesion layer mainly containing, for example, titanium (Ti), Ta, titanium oxide ($TiO_2$), nickel (Ni), ruthenium oxide ($RuO_2$), iridium oxide ($IrO_2$), or the like may also be provided between the KNN-film 3 and the top electrode film 4 in order to enhance an adhesiveness between them. A thickness of the top electrode film 4 can be, for example, 100 nm or more and 5000 nm or less. A thickness of the adhesion layer can be, for example, 1 nm or more and 200 nm or less when the adhesion layer is provided.

As described above, the piezoelectric stack 10 is provided with the ZnO-film 5, instead of a film containing Ti (e.g., the Ti-film), between the substrate 1 and the bottom electrode film 2, as the adhesion film (hereinafter also referred to as an "adhesion film") that enhances the adhesiveness between them. The above problem which occurs when the Ti-film is provided as the adhesion film, for example, does not occur, because zinc oxide (ZnO) is less likely to diffuse than Ti-element and hardly diffuses through the bottom electrode film 2 to the KNN-film 3. Also, Zn-element is inactive compared to Ti-element. Therefore, even when Zn-element diffuses to the KNN-film 3, Zn-element is less likely to trap O-element in the KNN-film 3, and oxygen defects are less likely to occur in the KNN-film 3.

Also, since the ZnO-film 5 is provided, the number of KNN-crystals whose (001) is parallel to the main surface of the substrate 1 can be increased in comparison with a case where the Ti-film is provided. That is, the number of KNN-crystals whose (001) is inclined at a predetermined angle with respect to the main surface of the substrate 1, can be decreased. Even when (001) of the KNN-crystals is inclined at the predetermined angle with respect to the main surface of the substrate 1, the inclination angle thereof can be reduced. As a result, the (001) diffraction peak is a sharper peak having a narrower half-value width and the intensity of the (001) diffraction peak is higher, in the case where the ZnO-film 5 is provided than in the case where the Ti-film is provided. For example, since the ZnO-film 5 is provided, a maximum intensity of the (001) diffraction peak can be 1000 cps or more and 1400 cps or less, and preferably 1100 cps or more and 1350 cps or less.

In contrast, the number of KNN-crystals whose (001) is inclined at a predetermined angle with respect to the main surface of the substrate 1 is increased and the inclination angle is also larger, in the case where the Ti-film is provided than in the case where the ZnO-film 5 is provided. As a result, the (001) diffraction peak is a peak having a wide half-value width, and the peak intensity decreases. In this case, the maximum intensity of the (001) diffraction peak is, for example, about 600 cps to 900 cps.

Also, since the ZnO-film 5 is provided, the KNN-film 3 having both a high orientation ratio and a low relative dielectric constant can be obtained. This is because it was found that, since the ZnO-film 5 is provided, the KNN-film 3 maintains the above high orientation ratio even when a deposition temperature of the KNN-film 3 is lowered (even at 500° C. or less, for example). This is a new finding obtained for the first time by the inventors. Since the ZnO-film 5 is provided as described above, the KNN-film 3 can be deposited at a low temperature without deteriorating the orientation (the orientation ratio) of the KNN-film 3, and thus the KNN-film 3 can also be a film having the low dielectric constant. For example, a relative dielectric constant ($\varepsilon_r$) of the KNN-film 3 can be 250 or more and 300 or less, preferably 250 or more and less than 300, and more preferably 250 or more and 270 or less, when measured by applying a voltage of −1 V to +1 V to the top electrode film 4 with a triangular wave having a frequency of 3 kHz while the bottom electrode film 2 is grounded (zero potential).

In contrast, when the Ti-film is provided, reducing the deposition temperature of the KNN-film 3 (e.g., 500° C. or less) deteriorates the orientation of the KNN-film 3. Therefore, when the Ti-film is provided, in order to prevent the orientation of the KNN-film 3 from deteriorating, the KNN-film 3 needs to be deposited at a high temperature (e.g., more than 500° C.), and as a result, the dielectric constant of the KNN-film 3 increases. In this case, the relative dielectric constant of the KNN-film 3 is, for example, about 300 to 500.

As described above, since the ZnO-film 5 is provided, the KNN-film 3 having both a favorable orientation and the low dielectric constant, for example, the KNN-film 3 having the high intensity of the (001) diffraction peak and the low dielectric constant can be obtained without causing the above problem.

(2) Configurations of Piezoelectric Element and Piezoelectric Device Module

Figure 3:
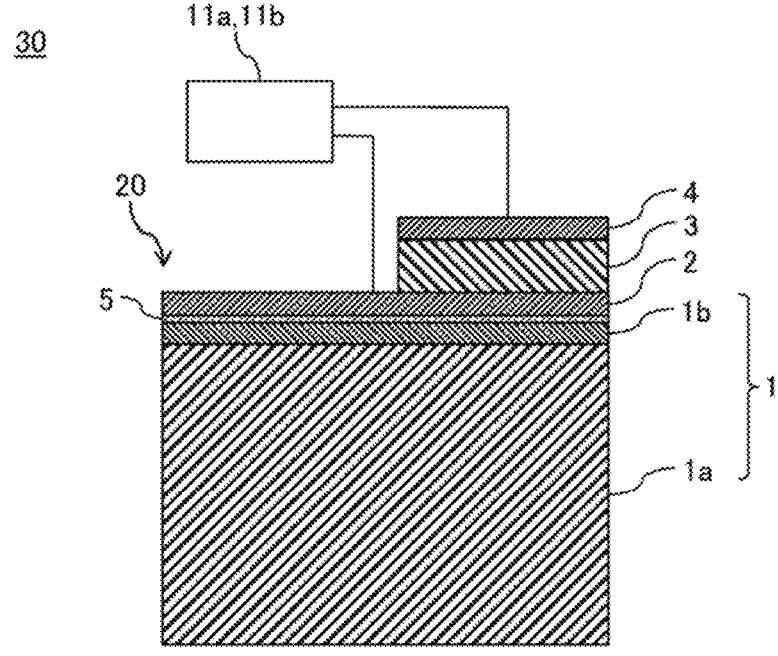
FIG. 3 is a view illustrating an example of a schematic configuration of a piezoelectric device module according to an aspect of the present disclosure.

FIG. 3 illustrates a schematic configuration view of a device module 30 (hereinafter also referred to as a piezoelectric device module 30) having the KNN-film 3 according to the present disclosure. The piezoelectric device module 30 includes at least an element (device) 20 (an element 20 having the KNN-film 3, hereinafter also referred to as a piezoelectric element 20) obtained by shaping the above piezoelectric stack 10 into a predetermined form, and a voltage applicator 11a or a voltage detector 11b connected to the piezoelectric element 20. The voltage applicator 11a is a means that applies a voltage between the bottom electrode film 2 and the top electrode film 4 (between electrodes), and the voltage detector 11b is a means that detects a voltage generated between the bottom electrode film 2 and the top electrode film 4 (between electrodes). Various known means can be used as the voltage applicator 11a and the voltage detector 11b.

The piezoelectric element 20 can function as an actuator by connecting the voltage applicator 11a between the bottom electrode film 2 and the top electrode film 4 of the piezoelectric element 20. The KNN-film 3 can be deformed by applying a voltage between the bottom electrode film 2 and the top electrode film 4 using the voltage applicator 11a. Various structures connected to the piezoelectric element 20 can be actuated due to this deformation motion. In this case, examples of applications of the piezoelectric element 20 include heads for inkjet printers, MEMS mirrors for scanners, and vibrators for ultrasonic generators.

The piezoelectric element 20 can function as a sensor by connecting the voltage detector 11b between the bottom electrode film 2 and the top electrode film 4 of the piezoelectric element 20. Some change in physical quantity is accompanied by the deformation of the KNN-film 3, which in turn generates a voltage between the bottom electrode film 2 and the top electrode film 4. A magnitude of the physical quantity applied to the KNN-film 3 can be measured by detecting the voltage using the voltage detector 11b. In this case, examples of applications of the piezoelectric element 20 include angular velocity sensors, ultrasonic sensors, pressure sensors, and acceleration sensors.

As described above, in the piezoelectric stack 10, the ZnO-film 5 is provided as the adhesion film, instead of the Ti-film. Therefore, there are few oxygen defects in the KNN-film 3, in particular, near the interface between the KNN-film 3 and the bottom electrode film 2. As a result, the piezoelectric element 20 obtained by processing the piezoelectric stack 10 is less likely to undergo dielectric breakdown even during a positive voltage application.

(3) Method of Manufacturing Piezoelectric Stack, Piezoelectric Element, and Piezoelectric Device Module A method of manufacturing the piezoelectric stack 10, the piezoelectric element 20, and the piezoelectric device module 30 will be described hereinafter.

The substrate 1 is firstly prepared, and the ZnO-film 5 is deposited on any one of main surfaces of the substrate 1 using, for example, the sputtering method. For example, the ZnO-film 5 is deposited in a mixed gas atmosphere of argon (Ar) gas and oxygen ($O_2$) gas (hereinafter also referred to as an "Ar/$O_2$-mixed gas atmosphere") by the RF sputtering method, using a target material containing zinc oxide.

The following conditions are exemplified as the conditions for depositing the ZnO-film 5. A deposition time for the ZnO-film 5 can be appropriately set according to the thickness of the ZnO-film 5. A deposition rate can be a rate at which the ZnO-film with the thickness of 2.5 nm can be deposited in 30 seconds, for example.

Temperature (substrate temperature): 200° C. or more, preferably 300° C. or more, more preferably 500° C. or more, further preferably 700° C. or less RF-power: 100 W or more and 500 W or less, preferably 200 W or more and 400 W or less Atmosphere: Ar/$O_2$-mixed gas atmosphere Partial pressure of Ar-gas relative to $O_2$-gas (partial pressure ratio of Ar-gas/$O_2$-gas): 5/1 to 30/1, preferably 7/1 to 20/1, more preferably 10/1 to 15/1

Atmospheric pressure: 0.1 Pa or more and 0.5 Pa or less, preferably 0.2 Pa or more and 0.4 Pa or less By depositing the ZnO-film 5 under the above conditions, in particular, under the above temperature condition, crystals constituting the ZnO-film 5 can be preferentially oriented in (0001) direction. That is, by depositing the ZnO-film 5 in a state where the substrate 1 is heated, a highly-oriented ZnO-film 5 can be obtained. Also, by depositing the ZnO-film 5 under the temperature condition of, for example, 300° C. or more, the orientation of the ZnO-film 5 can be more improved. Further, by depositing the ZnO-film 5 under the temperature condition of, for example, 500° C. or more, the orientation of the ZnO-film 5 can be further improved.

As described above, the orientation of the ZnO-film 5 tends to be high as the deposition temperature of the ZnO-film 5 is high. However, even when the deposition temperature of the ZnO-film 5 exceeds 700° C., the effect of improving the orientation of the ZnO-film 5 reaches the limit, whereas it takes time to lower the temperature in an atmosphere from the deposition temperature of the ZnO-film 5 to the later-described deposition temperature of the KNN-film 3. As a result, a productivity of the piezoelectric stack 10 sometimes decreases. Therefore, the deposition temperature of the ZnO-film 5 is preferably 700° C. or less.

Subsequently, the bottom electrode film 2 (e.g., the Pt-film) is deposited on the ZnO-film 5 in which crystals are preferentially oriented in (0001) direction in advance, using the sputtering method, for example.

The following conditions are exemplified as the conditions for depositing the bottom electrode film 2.

Temperature (substrate temperature): 200° C. or more, preferably 300° C. or more, more preferably 500° C. or more, further preferably 700° C. or less RF-power: 1000 W or more and 1500 W or less, preferably 1100 W or more and 1300 W or less Atmosphere: Ar-gas atmosphere Atmospheric pressure: 0.1 Pa or more and 0.5 Pa and less, preferably 0.2 Pa or more and 0.4 Pa or less Deposition time: 3 minutes or more and 10 minutes or less, preferably 4 minutes or more and 8 minutes or less, more preferably 5 minutes or more and 6 minutes or less By depositing the Pt-film as the bottom electrode film 2 under the above conditions, in particular, under the above temperature condition, crystals constituting the Pt-film can be preferentially oriented in (111) direction. That is, by depositing the Pt-film in the state where the substrate 1 is heated, a highly-oriented Pt-film can be obtained. Also, by depositing the Pt-film under the temperature condition of, for example, 300° C. or more, the orientation of the Pt-film can be more improved. Also, by depositing the Pt-film under the temperature condition of, for example, 500° C. or more, the orientation of the Pt-film can be further improved.

As described above, the orientation of the Pt-film tends to be high as the deposition temperature of the Pt-film is high. However, even when the deposition temperature of the Pt-film exceeds 700° C., the effect of improving the orientation of the Pt-film reaches the limit, whereas it takes time to lower the temperature in the atmosphere from the deposition temperature of the Pt-film to the later-described deposition temperature of the KNN-film 3. As a result, the productivity of the piezoelectric stack 10 sometimes decreases. Therefore, the deposition temperature of the Pt-film is preferably 700° C. or less.

Subsequently, the KNN-film 3 is deposited on the Pt-film in which crystals are preferentially oriented in (111) direction in advance, using the sputtering method, for example. A composition ratio of the KNN-film 3 can be adjusted by controlling a composition of a target material used in the sputtering deposition, for example. The target material can be produced, for example, by mixing and calcining $K_2CO_3$-powder, $Na_2CO_3$-powder, $Nb_2O_5$-powder, and the like. The composition of the target material can be controlled by adjusting a mixing ratio of $K_2CO_3$-powder, $Na_2CO_3$-powder, $Nb_2O_5$-powder, and the like. When the KNN-film 3 containing the element such as Cu or Mn is to be deposited, the target material may be used in which Cu-powder (or CuO-powder), Mn-powder (or MnO-powder), or the like is mixed at a predetermined ratio in addition to the above each of powders.

The following conditions are exemplified as the conditions for depositing the KNN-film 3. A deposition time can be appropriately set according to the thickness of the KNN-film 3.

RF-power: 2000 W or more and 2400 W or less, preferably 2100 W or more and 2300 W or less Atmosphere: Ar-gas+oxygen ($O_2$) gas atmosphere Atmospheric pressure: 0.2 Pa or more and 0.5 Pa or less, preferably 0.2 Pa or more and 0.4 Pa or less Partial pressure of Ar-gas relative to $O_2$-gas (partial pressure ratio of $Ar/O_2$): 30/1 to 20/1, preferably 27/1 to 22/1

Deposition temperature: 430° C. or more and 700° C. or less

Deposition rate: 0.5 µm/hr or more and 2 µm/hr or less, preferably 0.75 µm/hr or more and 1.5 µm/hr or less By depositing the KNN-film 3 on the bottom electrode film 2 in which crystals are preferentially oriented in (111) direction in advance, under the above conditions, crystals constituting the KNN-film 3 can be preferentially oriented in (001) direction. By depositing the ZnO-film 5 and the bottom electrode film 2 in the state where the substrate 1 is heated, i.e., by depositing the ZnO-film 5 and the bottom electrode film 2 at a high temperature, the orientation of the KNN-film 3 to be deposited on the bottom electrode film 2 can be improved. As a result, for example, 80% or more crystals constituting the KNN-film 3 can be oriented in (001) direction. That is, the KNN-film 3 having the above orientation ratio of, for example, 80% or more can be obtained.

The deposition temperature of the bottom electrode film 2 can be lower than the deposition temperature of the ZnO-film 5, as long as the deposition temperature of the ZnO-film 5 and the deposition temperature of the bottom electrode film 2 are each 200° C. or more. However, both the ZnO-film 5 and the bottom electrode film 2 are preferably deposited at a high temperature, from a viewpoint of improving the orientations of the ZnO-film 5 and the bottom electrode film 2 and reliably obtaining the highly-oriented KNN-film 3.

For example, by depositing the ZnO-film 5 and the bottom electrode film 2 under the temperature condition of 300° C. or more, 80% or more crystals constituting the KNN-film 3 can be reliably oriented in (001) direction. That is, the KNN-film 3 having the above orientation ratio of, for example, 80% or more can be reliably obtained.

Also, for example, by depositing the ZnO-film 5 and the bottom electrode film 2 under the temperature condition of 500° C. or more, 85% or more, and preferably 90% or more crystals constituting the KNN-film 3 can be oriented in (001) direction. That is, the KNN-film 3 having the above orientation ratio of, for example, 85% or more, and preferably 90% or more can be obtained.

When the piezoelectric element 20 functions as an actuator, the deposition temperature of the KNN-film 3 is preferably 500° C. or more and 700° C. or less, and more preferably 540° C. or more and 700° C. or less. As a result, a breakdown voltage of the KNN-film 3 can be reliably increased during a positive voltage application.

When the piezoelectric element 20 functions as a sensor, the deposition temperature of the KNN-film 3 is preferably 430° C. or more and 500° C. or less, and more preferably 440° C. or more and 470° C. or less. Since the ZnO-film 5 is provided, the KNN-film 3 can be a highly-oriented film even when the deposition temperature of the KNN-film 3 is lowered as described above. Also, by depositing the KNN-film 3 at such a low temperature, the KNN-film 3 can be a film having the low dielectric constant. That is, the KNN-film 3 having both the high orientation ratio and the low dielectric constant can be obtained, which can be suitably used as a sensor.

Then, the top electrode film 4 is deposited on the KNN-film 3 using, for example, the sputtering method. Conditions for depositing the top electrode film 4 can be similar to the above conditions for depositing the bottom electrode film 2.

The piezoelectric stack 10 as illustrated in FIG. 1 is obtained by depositing, on the substrate 1, the ZnO-film 5, the bottom electrode film 2 (Pt-film), the KNN-film 3, and the top electrode film 4 in this order under the above conditions.

The obtained piezoelectric stack 10 is shaped into a predetermined form (is subjected to fine processing into a predetermined pattern) using an etching or the like. As a result, the piezoelectric element 20 as illustrated in FIG. 3 is obtained, and the piezoelectric device module 30 is obtained by connecting the voltage applicator 11*a* or the voltage detector 11*b* to the piezoelectric element 20. For example, a dry etching method such as reactive ion etching, or a wet etching method using a predetermined etchant can be used as the etching method.

When the piezoelectric stack 10 is shaped by the dry etching, a photoresist pattern as an etching mask for the dry etching is formed on the piezoelectric stack 10 (e.g., on the top electrode film 4) by a photolithography process or the like. A noble metal film (a metal mask) such as a chromium (Cr) film, a nickel (Ni) film, a platinum (Pt) film, or a Ti-film may be formed as the etching mask by the sputtering method. Then, the dry etching is performed on the piezoelectric stack 10 (the top electrode film 4, the KNN-film 3, and the like) using a gas containing a halogen element as an etching gas. The halogen element include chlorine (Cl), fluorine (F), and the like. $BCl_3$-gas, $SiCl_4$-gas, chlorine ($Cl_2$) gas, $CF_4$-gas, $C_4F_8$-gas, or the like can be used as the gas containing the halogen element.

When the piezoelectric stack 10 is shaped by the wet etching, a silicon oxide ($SiO_x$) film or the like as an etching mask for the wet etching is formed on the piezoelectric stack 10 (e.g., on the top electrode film 4). Then, the wet etching is performed on the piezoelectric stack 10 (the top electrode film 4, the KNN-film 3, and the like) by immersing the piezoelectric stack 10, for example, in an etchant containing an alkaline aqueous solution of a chelating agent and not containing hydrofluoric acid. An etchant obtained by mixing ethylenediaminetetraacetic acid as the chelating agent, aqueous ammonia, and aqueous hydrogen peroxide, can be used as the etchant containing the alkaline aqueous solution of the chelating agent and not containing hydrofluoric acid.

(4) Effects

According to this aspect, one or more of the following effects are obtained.

(a) Since the ZnO-film 5 is provided as the adhesion film that brings the substrate 1 and the bottom electrode film

2 into tight contact with each other, instead of the film containing Ti (e.g., the Ti-film), the adhesiveness can be maintained at a level similar to or higher than that in the case where the Ti-film is provided. Also, zinc oxide is less likely to diffuse than Ti-element. Therefore, since the adhesion film is constituted of the ZnO-film 5, an amount of the elements diffusing to the KNN-film 3 can be reduced in comparison with the case where the adhesion film is constituted of the Ti-film. Accordingly, occurrences of oxygen defects can be suppressed in the KNN-film 3, in particular, near the interface between the KNN-film 3 and the bottom electrode film 2. As a result, the breakdown voltage of the KNN-film 3 can be increased during a positive voltage application, and a reduction in an insulating property can be avoided during a positive voltage application. That is, in the piezoelectric element 20 obtained by processing the above piezoelectric stack 10, dielectric breakdown is less likely to occur even in the case of a positive voltage application.

For example, when a highly accelerated life test (abbreviated as HALT) is performed in which the bottom electrode film 2 is grounded and a positive voltage is applied in a state where the piezoelectric stack 10 (the piezoelectric element 20) is heated so that its temperature reaches 200° C., to the top electrode film 4 such that an electric field of 300 kV/cm (an electric field directed from the top electrode film 4 toward the bottom electrode film 2) is generated between the bottom electrode film 2 and the top electrode film 4, it takes 1500 seconds or more from a start of the voltage application until the KNN-film 3 undergoes dielectric breakdown. In this aspect, it is judged that the KNN-film 3 has undergone dielectric breakdown when a leakage current density flowing through the KNN-film 3 exceeds 30 mA/cm².

It is also proposed to deposit a film containing tantalum (Ta), tantalum oxide ($Ta_2O_5$), nickel (Ni), or the like as main components and not containing Ti, or a titanium oxide ($TiO_2$) film as the adhesion film. However, these films are problematic in that their adhesive force is apparently weaker than that of the Ti-film and the ZnO-film 5. To address this, since the ZnO-film 5 is provided as the adhesion film in this aspect, the adhesiveness can be maintained at a level similar to or higher than that of the Ti-film.

(b) Also, since the ZnO-film 5 is provided as the adhesion film that brings the substrate 1 and the bottom electrode film 2 into tight contact with each other, the number of KNN-crystals whose (001) is parallel to the main surface of the substrate 1 can be increased in comparison with the case where the Ti-film is provided. As a result, the KNN-film 3 can be a film in which the intensity of the (001) diffraction peak is high. For example, the maximum intensity of the (001) diffraction peak can be 1000 cps or more and 1400 cps or less.

(c) Also, since the ZnO-film 5 is provided as the adhesion film that brings the substrate 1 and the bottom electrode film 2 into tight contact with each other, the KNN-film 3 can be a film having both the high orientation ratio and the low dielectric constant. This is because, since the ZnO-film 5 is provided, the KNN-film 3 can be deposited at a low temperature without reducing the orientation ratio of the KNN-film 3. Since the KNN-film 3 can be deposited at a low temperature, the KNN-film 3 can be a film having the low dielectric constant. For example, the relative dielectric constant of the KNN-film 3 can be 250 or more and 300 or less when measured by applying a voltage of −1 V to +1 V with a triangular wave having a frequency of 3 kHz while the bottom electrode film 2 is grounded. The piezoelectric stack 10 having such a KNN-film 3 can be particularly suitably used for applications such as highly sensitive sensors which are required to have the low dielectric constant.

(d) Since the (001) orientation ratio of the crystals constituting the KNN-film 3 is 80% or more, the piezoelectric element 20 having a HALT result of 1500 seconds or more, and preferably 1600 seconds or more, can be obtained when performing HALT under the predetermined conditions. Also, since the (001) orientation ratio of the crystals constituting the KNN-film 3 is 90% or more, the piezoelectric element 20 having a HALT result of 1800 seconds or more can be obtained when performing HALT under the predetermined conditions.

(e) Since the thickness of the ZnO-film 5 is, for example, 1 nm or more, the ZnO-film 5 can reliably function as the adhesion film that brings the substrate 1 and the bottom electrode film 2 into tight contact with each other. As a result, it is possible to reliably prevent the bottom electrode film 2 from peeling off from the substrate 1 in a manufacturing process of the piezoelectric stack 10, the piezoelectric element 20, and the piezoelectric device module 30, or during a voltage application. Also, since the thickness of the ZnO-film 5 is, for example, 1 nm or more, the orientation of the KNN-film 3 can be more improved.

(f) By depositing the ZnO-film 5 and the bottom electrode film 2 in the state where the substrate 1 is heated, i.e., by depositing the ZnO-film 5 and the bottom electrode film 2 at a high temperature, the orientation of the KNN-film 3 to be deposited on the bottom electrode film 2 can be improved. Also, the highly-oriented KNN-film 3 can be obtained without performing annealing on the ZnO-film 5 and the bottom electrode film 2.

It is also conceivable that the ZnO-film 5 and the bottom electrode film 2 are deposited under a condition of a low temperature less than 200° C., and then annealing is performed on the ZnO-film 5 and the bottom electrode film 2. However, the inventors have been confirmed that the highly-oriented KNN-film 3 cannot be deposited on the bottom electrode film 2 in this case.

Other Aspects

As described above, explanation has been given specifically for the aspects of the present disclosure. However, this disclosure is not limited thereto, and can be variously modified in a range not departing from the gist of this disclosure. Further, these aspects can be combined arbitrarily.

For example, the bottom electrode film 2 can also be deposited using metal oxides such as strontium ruthenium oxide (SrRuO₃; abbreviated as SRO) or lanthanum nickel oxide (LaNiO₃; abbreviated as LNO). When the bottom electrode film 2 is deposited using the metal oxide, crystals constituting the bottom electrode film 2 are preferably mostly crystals whose (001) is parallel to the main surface of the substrate 1 (including crystals in which (001) is inclined at an angle of ±5 degrees or less with respect to the main surface of the substrate 1), i.e., the crystals constituting the bottom electrode film 2 are preferably preferentially oriented in (001) direction. In this aspect as well, by depositing the bottom electrode film 2 under the temperature condition similar to that in the above aspect, the bottom electrode film 2 preferentially oriented in (001) direction can be deposited. Also, the bottom electrode film 2 may also be a single-layer film deposited using the above-listed various metals or metal oxides; a stack including a metal film deposited using a metal such as Pt and a film containing SRO provided on the metal film; a stack including the metal film and a film containing LNO provided on the metal film; or the like. This aspect can also provide the effects similar to those in the above aspect.

Also, for example, when the above piezoelectric stack 10 is shaped into the piezoelectric element 20, the substrate 1 may be removed from the piezoelectric stack 10 as long as the piezoelectric element 20 produced using the piezoelectric stack 10 can be applied to a desired application such as sensors or actuators.

EXAMPLES

Experimental results supporting effects of the above embodiments will be described hereinafter.

(a) Samples 1 to 16 of piezoelectric stacks were produced, and an evaluation regarding the orientation of a KNN-film, an evaluation regarding the adhesiveness between a substrate and a bottom electrode film, and an evaluation regarding the insulating property during a positive voltage application were performed.

A Si-substrate having a surface of (100) direction, having a thickness of 610 μm and a diameter of 6 inches, and having a thermal oxide film (SiO₂ film) with a thickness of 200 nm provided on its surface, was prepared as a substrate. Then, piezoelectric stacks (samples 1 to 16) were produced by depositing, on the substrate (on the thermal oxide film), a first adhesion film, a Pt-film (thickness: 200 nm) as a bottom electrode film, a KNN-film (thickness: 2μm) as a piezoelectric film, a RuO₂-film (thickness: 10 nm) as a second adhesion film, and a Pt-film (thickness: 100 nm) as a top electrode film in this order. The first adhesion film is a film that brings the substrate and the bottom electrode film into tight contact with each other, and the second adhesion film is a film that brings the KNN-film and the top electrode film into tight contact with each other. A ZnO-film or a Ti-film was deposited as the first adhesion film. Also, a thickness of the first adhesion film was varied in a range of 0.5 nm or more and 50 nm or less.

The first adhesion film (the ZnO-film or the Ti-film) was deposited using the RF magnetron sputtering method. Conditions for depositing the first adhesion film were as follows. In the following conditions, a deposition temperature indicates a temperature of a heater provided in a sputtering device (the same applies to conditions for depositing other films). Also, the term "deposition temperature is room temperature" indicates that the first adhesion film is deposited in an unheated state. Further, a deposition time was appropriately varied according to a thickness of the first adhesion film to be deposited.

Deposition temperature: predetermined temperature in a range of room temperature (e.g., 28° C.) or more and 700° C. or less Atmosphere: mixed gas atmosphere of Ar-gas and O₂-gas Gas: Ar-gas: 100 cc, O₂-gas: 10 cc Atmospheric pressure: 0.2 Pa RF-power: 300 W Deposition rate: rate at which the first adhesion film with the thickness of 2.5 nm is deposited in 30 seconds The bottom electrode film and the top electrode film were deposited using the RF magnetron sputtering method. Conditions for depositing the bottom electrode film and the top electrode film were as follows.

Deposition temperature: 300° C.

RF-power: 1200 W

Gas: Ar-gas

Atmospheric pressure: 0.3 Pa

Deposition time: 5 minutes

The KNN-film was deposited using the RF magnetron sputtering method. $(K_{1-x}Na_x)NbO_3$ sintered ceramics having a composition of (K+Na)/Nb=0.8 to 1.2 and Na/(K+Na)=0.4 to 0.7 were used as a sputtering target material when depositing the KNN-film. The target material was produced by mixing $K_2CO_3$-powder, $Na_2CO_3$-powder, and $Nb_2O_5$-powder using a ball mill for 24 hours, pre-calcining the resulting mixture at 850° C. for 10 hours, pulverizing the mixture using a ball mill again, shaping the mixture under a pressure of 200 MPa, and calcining the resulting mixture at 1080° C. The composition of the target material was controlled by adjusting a mixing ratio of $K_2CO_3$-powder, $Na_2CO_3$-powder, and $Nb_2O_5$-powder, and was measured by EDX (energy-dispersive X-ray spectroscopy) before performing a deposition process.

Conditions for depositing the KNN-film were as follows.

Deposition temperature: 550° C.

RF-power: 2200 W

Gas: mixed gas of Ar-gas and $O_2$-gas

Atmospheric pressure: 0.3 Pa

Partial pressure ratio of Ar-gas relative to $O_2$-gas (Ar-gas partial pressure/$O_2$-gas partial pressure): 25/1

Deposition rate: 1 μm/hr

Then, for each sample, the evaluation regarding the orientation of the KNN-film, the evaluation regarding the adhesiveness between the substrate and the bottom electrode film, and the evaluation regarding the insulating property during a positive voltage application were performed. These evaluation results are shown in the following Table 1.

Evaluation Regarding Orientation

The evaluation regarding the orientation of the KNN-film was performed by measuring the (001) orientation ratio of crystals constituting the KNN-film. With regard to the orientation ratio of the KNN-film, an X-ray diffraction pattern was obtained by performing XRD measurement on each sample. Conditions for XRD measurement were as follows.

Device name: Bruker D8DISCOVER (registered trademark, manufactured by Bruker)

Output voltage: 50 kV

Output current: 22 mA

Thickness of KNN-film: 2 um

The orientation ratio was calculated using the above (Math. 1) based on the peak intensity in the obtained diffraction pattern. Calculating results of the orientation ratio were shown in the above Table 1.

As shown in Table 1, it can be confirmed that, when the ZnO-film was deposited as the first adhesion film, the orientation of the KNN-film can be improved by individually depositing the ZnO-film and the bottom electrode film at the temperature of 200° C. or more, and the KNN-film having the above orientation ratio of 80% or more can be obtained. It can be confirmed that, when the ZnO-film and the bottom electrode film were deposited in the unheated state or deposited at the temperature of less than 200° C., the orientation of the KNN-film cannot be improved, and the orientation ratio thereof was less than 80%.

Also, as shown in Table 1, it can be confirmed that, by depositing the ZnO-film as the first adhesion film and the bottom electrode film at the temperature of 300° C., the orientation of the KNN-film can be more improved in comparison with the case where the ZnO-film and the bottom electrode film were deposited at the temperature of 200° C.

TABLE 1

| Sample No. | First Adhesion Film | | | Bottom Electrode Film | KNN-film | | Insulating Property |
| | film type | thickness (nm) | deposition temp. (° C.) | deposition temp. (° C.) | orientation ratio (%) | Adhesiveness film peeled off | HALT life (sec) |
|---|---|---|---|---|---|---|---|
| 1 | ZnO | 2 | unheated (RT) | unheated (RT) | 68 | No | 540 |
| 2 | ZnO | 2 | 100 | 100 | 72 | No | 600 |
| 3 | ZnO | 2 | 200 | 200 | 80 | No | 1500 |
| 4 | ZnO | 2 | 300 | 300 | 84 | No | 1600 |
| 5 | ZnO | 2 | 500 | 500 | 96 | No | 1800 sec or more |
| 6 | ZnO | 2 | 700 | 700 | 100 | No | 1800 sec or more |
| 7 | ZnO | 0.5 | 500 | 500 | 85 | Yes | 1700 |
| 8 | ZnO | 1 | 500 | 500 | 91 | No | 1800 sec or more |
| 9 | ZnO | 10 | 500 | 500 | 100 | No | 1800 sec or more |
| 10 | ZnO | 50 | 500 | 500 | 100 | No | 1800 sec or more |
| 11 | ZnO | 2 | 500 | 500 | 97 | No | 1800 sec or more |
| 12 | ZnO | 2 | 500 | 500 | 95 | No | 1800 sec or more |
| 13 | ZnO | 2 | 500 | 500 | 90 | No | 1800 sec or more |
| 14 | Ti | 1 | 500 | 500 | 93 | Yes | 180 |
| 15 | Ti | 2 | 500 | 500 | 95 | No | 180 |
| 16 | Ti | 10 | 500 | 500 | 70 | No | 120 |

Also, as shown in Table 1, it can be confirmed that, by depositing the ZnO-film as the first adhesion film and the bottom electrode film at the temperature of 500° C. or more (e.g., 500° C., 700° C.), the orientation of the KNN-film can be further improved, and the KNN-film having the above orientation ratio of 90% or more can be obtained.

Furthermore, as shown in Table 1, it can be confirmed that, when the Ti-film was deposited as the first adhesion film, the orientation ratio of the KNN-film was sometimes less than 80% even when the deposition temperature of the Ti-film and the deposition temperature of the bottom electrode film were 500° C.

Evaluation Regarding Adhesiveness

The adhesiveness was evaluated by visually checking whether or not the bottom electrode film was peeled off from the substrate (whether or not the film was peeled off). In Table 1, "No" indicates that no part of the bottom electrode film peeled off from the substrate was observed, and "Yes" indicates that a part of the bottom electrode film peeled off from the substrate was observed.

As shown in Table 1, it can be confirmed that, since the thickness of the ZnO-film as the first adhesion film was 1 nm or more, an adhesive force can be maintained at a level similar to or higher than that in the case where the Ti-film was provided as the first adhesion film. It can be confirmed that, when the thickness of the ZnO-film as the first adhesion film was less than 1 nm (e.g., 0.5 nm), the adhesive force was weak and a part of the bottom electrode film peeled off from the substrate was observed. Also, it can be confirmed that, when the Ti-film having a thickness of 1 nm was provided as the first adhesion film, a part of the bottom electrode film peeled off from the substrate was observed.

Evaluation Regarding Insulating Property

The insulating property during a positive voltage application was evaluated by measuring the time from a start of a voltage application until the KNN-film undergoes dielectric breakdown, when HALT was performed in which the bottom electrode film is grounded and a positive voltage was applied in a state where each piezoelectric stack (each sample) was heated so that its temperature reached 200° C., to the top electrode film such that an electric field of 300 kV/cm (an electric field directed from the top electrode film toward the bottom electrode film) was generated between the bottom electrode film and the top electrode film. It was judged that the KNN-film underwent dielectric breakdown when the leakage current density flowing through the KNN-film exceeded 30 mA/cm². The time taken until the KNN-film undergoes dielectric breakdown, which was measured in the HALT under the above conditions, is defined as a "HALT life". The HALT life of each sample is as shown in Table 1. These HALT lives (measurement results) were each average of values measured at seven positions within 0.5 mmø for each sample. The term "1800 seconds or more" in Table 1 indicates that the sample did not undergo dielectric breakdown even after 1800 seconds from the start of the voltage application.

As shown in Table 1, it can be confirmed that the samples provided with the ZnO-film as the first adhesion film were less likely to undergo dielectric breakdown during a positive voltage application than the samples provided with the Ti-film as the first adhesion film. That is, it can be confirmed that the samples provided with the ZnO-film have a longer HALT life than the samples provided with the Ti-film.

Also, as shown in Table 1, it can be confirmed that, by depositing the ZnO-film and the bottom electrode film under the temperature condition of 200° C. or more, the piezoelectric stack (the KNN-film) can be obtained in which the orientation ratio of the KNN-film is 80% or more and the HALT life is 1500 seconds or more.

Also, as shown in Table 1, it can be confirmed that, by depositing the ZnO-film and the bottom electrode film under the temperature condition of 300° C. or more, the piezoelectric stack can be obtained in which the orientation of the KNN-film is further improved and the HALT life is 1600 seconds or more.

Further, as shown in Table 1, it can be confirmed that, by depositing the ZnO-film and the bottom electrode film under the temperature condition of 500° C. or more, a piezoelectric stack can be obtained in which the orientation ratio of the KNN-film is 90% and the HALT life is 1800 seconds or more. It can be confirmed that, when the thickness of the ZnO-film is less than 1 nm (e.g., 0.5 nm), by depositing the ZnO-film and the bottom electrode film under the temperature condition of 500° C. or more, the piezoelectric stack can be obtained in which the orientation ratio of the KNN-film is 85% or more and the HALT life is 1700 seconds or more. However, it was confirmed that, when the thickness of the ZnO-film is less than 1 nm, the piezoelectric stack is hardly obtained in which the orientation ratio of the KNN-film is 90% or more and the HALT life is 1800 seconds or more, even when the ZnO-film and the bottom electrode film is deposited under the temperature condition of 500° C. or more.

(b) Also, samples 17 to 21 of the piezoelectric stack were produced, and evaluations regarding the (001) orientation ratio of crystals constituting the KNN-film, intensity of the (001) diffraction peak of the KNN-film, and the relative dielectric constant were performed.

With samples 17 to 21, the thickness of the ZnO-film or the Ti-film as the first adhesion film was as shown in the following Table 2, and the deposition temperature of the first adhesion film was 500° C. Also, the deposition temperature of the bottom electrode film was 500° C. Further, the deposition temperature of the KNN-film was 460° C. Other methods and conditions were similar to the methods and conditions for the above samples 1 to 16.

TABLE 2

| Sample No. | First Adhesion Film | | | Bottom Electrode Film | KNN-film | 001- | Relative Dielectric |
| | film type | thickness (nm) | deposition temp. (° C.) | deposition temp. (° C.) | orientation ratio (%) | Intensity CPS | Constant $\varepsilon_r$ |
|---|---|---|---|---|---|---|---|
| 17 | ZnO | 2 | 500 | 500 | 100 | 1134 | 257 |
| 18 | ZnO | 10 | 500 | 500 | 100 | 1344 | 256 |
| 19 | ZnO | 2 | 500 | 500 | 100 | 1282 | 265 |
| 20 | Ti | 2 | 500 | 500 | 100 | 708 | 485 |
| 21 | Ti | 10 | 500 | 500 | 70 | 611 | 490 |

Evaluation

With regard to samples 17 to 21, evaluations regarding the (001) orientation ratio of crystals constituting the KNN-film, the intensity of the (001) diffraction peak of the KNN-film, and the relative dielectric constant were performed.

The (001) orientation ratio of the crystals constituting the KNN-film was measured using a method and conditions similar to those in the measurement of the orientation ratios of samples 1 to 16.

The intensity of the (001) diffraction peak of the KNN-film was calculated as follows: XRD measurement was performed on each of samples 17 to 21 to obtain an X-ray diffraction pattern $(2\theta/\theta)$, and then, in the obtained X-ray diffraction pattern, the maximum intensity of a peak which appeared in a range that $2\theta$ is 20 degrees to 23 degrees, was measured. Conditions for XRD measurement were as follows.

Device name: Bruker D8DISCOVER (registered trademark, manufactured by Bruker)

Output voltage: 50 kV

Output current: 22 mA

Thickness of KNN-film: 2 um

The relative dielectric constant was measured by applying a voltage of −1 V to +1V to the top electrode film 4 with a triangular wave having a frequency of 3 kHz while the bottom electrode film 2 was grounded.

Measuring results of the orientation ratio, the intensity of the diffraction peak, and the relative dielectric constant were as shown in the above Table 2. The term "001-Intensity" in Table 2 indicates the intensity of the (001) diffraction peak of the KNN-film.

As shown in Table 2, it can be confirmed that, since the ZnO-film was provided as the first adhesion film, the orientation of the KNN-film did not deteriorate even when the deposition temperature of the KNN-film was a low temperature (500° C. or less, e.g., 460° C.). That is, it can be confirmed that, since the ZnO-film is provided, the maximum intensity of the (001) diffraction peak can be 1000 cps or more and 1400 cps or less, and preferably 1100 cps or more and 1350 cps or less, even when the KNN-film is deposited at a low temperature.

It can be also confirmed that, by depositing the KNN-film at a low temperature, the relative dielectric constant of the KNN-film can be reduced. That is, it can be confirmed that the relative dielectric constant can be 250 or more and 300 or less, preferably 250 or more and less than 300, and more preferably 250 or more and 270 or less.

As shown in Table 2, it can be confirmed that, since the ZnO-film is provided, the KNN-film can be deposited at a low temperature without deteriorating the orientation of the KNN-film. That is, it can be confirmed that, since the ZnO-film is provided, the KNN-film having both the high orientation ratio and the low dielectric constant can be obtained. Such a KNN-film can be particularly suitably used for applications of highly sensitive sensors.

On the other hand, as shown in Table 2, it can be confirmed that, in the case where the Ti-film is provided as the first adhesion film, the orientation of the KNN-film deteriorates when the KNN-film is deposited at a low temperature (500° C. or less). That is, it can be confirmed that the above orientation ratio was sometimes less than 80%, and the maximum intensity of the (001) diffraction peak was sometimes less than 1000. Further, in this case, it can be also confirmed that the relative dielectric constant of the KNN-film is about 300 to 500. That is, it was found that, when the Ti-film is provided as the first adhesion film, the KNN-film having both the high orientation ratio and the low dielectric constant cannot be obtained.

Preferable Aspects of Present Disclosure

Preferable aspects of the present disclosure will be supplementarily described hereinafter.

Supplementary Description 1

According to an aspect of the present disclosure, there is provided a piezoelectric stack, including:

a substrate;

an oxide film on the substrate, containing zinc and oxygen as main elements;

an electrode film on the oxide film; and a piezoelectric film on the electrode film, being an alkali niobium oxide film containing potassium, sodium, niobium, and oxygen and having a perovskite structure.

Supplementary Description 2

Preferably, there is provided the piezoelectric stack according to the supplementary description 1, wherein a (001) orientation ratio of crystals constituting the piezoelectric film is 80% or more.

Supplementary Description 3

Preferably, there is provided the piezoelectric stack according to the supplementary description 1 or 2, wherein when a positive voltage is applied at a temperature of 200° C., to a top electrode film being a film on the piezoelectric film and different from the electrode film such that an electric field of 300 kV/cm is generated between the electrode film and the top electrode film, it takes 1500 seconds or more, preferably 1600 seconds or more, from a start of the voltage application until a density of a leakage current flowing through the piezoelectric film exceeds 30 mA/cm².

Supplementary Description 4

Preferably, there is provided the piezoelectric stack according to the supplementary description 1, wherein a (001) orientation ratio of crystals constituting the piezoelectric film is 90% or more.

Supplementary Description 5

Preferably, there is provided the piezoelectric stack according to the supplementary description 4, wherein when a positive voltage is applied at a temperature of 200° C., to a top electrode film being a film on the piezoelectric film and different from the electrode film such that an electric field of 300 kV/cm is generated between the electrode film and the top electrode film, it takes 1800 seconds or more, from a start of the voltage application until a density of a leakage current flowing through the piezoelectric film exceeds 30 mA/cm².

Supplementary Description 6

Preferably, there is provided the piezoelectric stack according to any one of the supplementary descriptions 1 to 5, wherein a relative dielectric constant of the piezoelectric film is 250 or more and 300 or less when measured by applying a voltage of −1 V to +1 V to a top electrode film being a film on the piezoelectric film and different from the electrode film, with a triangular wave having a frequency of 3 kHz while the electrode film is grounded (zero potential).

Supplementary Description 7

Preferably, there is provided the piezoelectric stack according to any one of the supplementary descriptions 1 to 6, wherein a thickness of the oxide film is 1 nm or more.

Supplementary Description 8

Preferably, there is provided the piezoelectric stack according to any one of the supplementary descriptions 1 to 7, further including a top electrode film, being an electrode film different from the electrode film, on the piezoelectric film.

Supplementary Description 9

According to another aspect of the present disclosure, there is provided a piezoelectric element or a piezoelectric device module, including:
  a substrate;
  an oxide film on the substrate, containing zinc and oxygen as main elements;
  a bottom electrode film on the oxide film;
  a piezoelectric film on the bottom electrode film, being an alkali niobium oxide film containing potassium, sodium, niobium, and oxygen and having a perovskite structure; and
  a top electrode film on the piezoelectric film.

Supplementary Description 10

Preferably, there is provided the piezoelectric element or the piezoelectric device module according to the supplementary description 9, wherein a (001) orientation ratio of crystals constituting the piezoelectric film is 80% or more.

Supplementary Description 11

Preferably, there is provided the piezoelectric element or the piezoelectric device module according to the supplementary description 9 or 10, wherein when a positive voltage is applied at a temperature of 200° C., to the top electrode film such that an electric field of 300 kV/cm is generated between the top electrode film and the bottom electrode film, it takes 1500 seconds or more, preferably 1600 seconds or more, from a start of the voltage application until a density of a leakage current flowing through the piezoelectric film exceeds 30 mA/cm$^2$.

Supplementary Description 12

Preferably, there is provided the piezoelectric element or the piezoelectric device module according to the supplementary description 9, wherein a (001) orientation ratio of crystals constituting the piezoelectric film is 90% or more.

Supplementary Description 13

Preferably, there is provided the piezoelectric element or the piezoelectric device module according to the supplementary description 12, wherein when a positive voltage is applied at a temperature of 200° C., to the top electrode film such that an electric field of 300 kV/cm is generated between the top electrode film and the bottom electrode film, it takes 1800 seconds or more, from a start of the voltage application until a density of a leakage current flowing through the piezoelectric film exceeds 30 mA/cm$^2$.

Supplementary Description 14

According to further another aspect of the present disclosure, there is provided a method of manufacturing a piezoelectric stack, including:
  depositing an oxide film on a substrate, containing zinc and oxygen as main elements;
  depositing an electrode film on the oxide film; and
  depositing a piezoelectric film on the electrode film, being an alkali niobium oxide film containing potassium, sodium, niobium, and oxygen and having a perovskite structure.

Supplementary Description 15

Preferably, there is provided the method according to the supplementary description 14, wherein, in the deposition of the oxide film, the oxide film is deposited under a temperature condition of 200° C. or more, and
  in the deposition of the electrode film, the electrode film is deposited under a temperature condition of 200° C. or more.

Supplementary Description 16

Preferably, there is provided the method according to the supplementary description 14 or 15,
  wherein, in the deposition of the oxide film, crystals constituting the oxide film is preferentially oriented in (0001) direction, and
  in the deposition of the electrode film, crystals constituting the electrode film is preferentially oriented in a predetermined direction. Preferably, in the deposition of the electrode film, when a metal film is deposited as the electrode film, crystals constituting the electrode film is preferentially oriented in (111) direction, and when a predetermined oxide film is deposited as the electrode film, crystals constituting the electrode film is preferentially oriented in (001) direction.

DESCRIPTION OF SIGNS AND NUMERALS

1 Substrate
3 Piezoelectric film
10 Piezoelectric stack

The invention claimed is:

1. A piezoelectric stack comprising:
  a substrate;
  an oxide film on the substrate, containing zinc and oxygen as main elements;
  an electrode film on the oxide film; and
  a piezoelectric film on the electrode film, being an alkali niobium oxide film containing potassium, sodium, niobium, and oxygen and having a perovskite structure,
  wherein crystals constituting the oxide film are preferentially oriented in (0001) direction.

2. The piezoelectric stack according to claim 1, wherein a (001) orientation ratio of crystals constituting the piezoelectric film is 80% or more.

3. The piezoelectric stack according to claim 2, wherein a relative dielectric constant of the piezoelectric film is 250 or more and 300 or less when measured by applying a voltage of −1 V to +1 V to a top electrode film being a film on the piezoelectric film and different from the electrode film, with a triangular wave having a frequency of 3 kHz while the electrode film is grounded.

4. The piezoelectric stack according to claim 2, wherein a thickness of the oxide film is 1 nm or more.

5. The piezoelectric stack according to claim 2, further comprising a top electrode film, being an electrode film different from the electrode film, on the piezoelectric film.

6. The piezoelectric stack according to claim 1, wherein a (001) orientation ratio of crystals constituting the piezo-electric film is 90% or more.

7. The piezoelectric stack according to claim 6, wherein a relative dielectric constant of the piezoelectric film is 250 or more and 300 or less when measured by applying a voltage of −1 V to +1 V to a top electrode film being a film on the piezoelectric film and different from the electrode film, with a triangular wave having a frequency of 3 kHz while the electrode film is grounded.

8. The piezoelectric stack according to claim 6, wherein a thickness of the oxide film is 1 nm or more.

9. The piezoelectric stack according to claim 6, further comprising a top electrode film, being an electrode film different from the electrode film, on the piezoelectric film.

10. The piezoelectric stack according to claim 1, wherein a relative dielectric constant of the piezoelectric film is 250 or more and 300 or less when measured by applying a voltage of −1 V to +1 V to a top electrode film being a film on the piezoelectric film and different from the electrode film, with a triangular wave having a frequency of 3 kHz while the electrode film is grounded.

11. The piezoelectric stack according to claim 10, wherein a thickness of the oxide film is 1 nm or more.

12. The piezoelectric stack according to claim 1, wherein a thickness of the oxide film is 1 nm or more.

13. The piezoelectric stack according to claim 1, further comprising a top electrode film, being an electrode film different from the electrode film, on the piezoelectric film.

14. A piezoelectric element comprising:

a substrate;

an oxide film on the substrate, containing zinc and oxygen as main elements;

a bottom electrode film on the oxide film;

a piezoelectric film on the bottom electrode film, being an alkali niobium oxide film containing potassium, sodium, niobium, and oxygen and having a perovskite structure; and a top electrode film on the piezoelectric film, wherein crystals constituting the oxide film are preferentially oriented in (0001) direction.

15. The piezoelectric element according to claim 14, wherein a (001) orientation ratio of crystals constituting the piezoelectric film is 80% or more.

16. The piezoelectric element according to claim 14, wherein when a positive voltage is applied at a temperature of 200° C., to the top electrode film such that an electric field of 300 kV/cm is generated between the top electrode film and the bottom electrode film, it takes 1500 seconds or more, from a start of the voltage application until a density of a leakage current flowing through the piezoelectric film exceeds 30 mA/cm$^2$.

17. The piezoelectric element according to claim 14, wherein a (001) orientation ratio of crystals constituting the piezoelectric film is 90% or more.

18. The piezoelectric element according to claim 17, wherein when a positive voltage is applied at a temperature of 200° C., to the top electrode film such that an electric field of 300 kV/cm is generated between the top electrode film and the bottom electrode film, it takes 1800 seconds or more, from a start of the voltage application until a density of a leakage current flowing through the piezoelectric film exceeds 30 mA/cm$^2$.

19. A method of manufacturing a piezoelectric stack, comprising:

depositing an oxide film on a substrate, containing zinc and oxygen as main elements;

depositing an electrode film on the oxide film; and depositing a piezoelectric film on the electrode film, being an alkali niobium oxide film containing potassium, sodium, niobium, and oxygen and having a perovskite structure, wherein crystals constituting the deposited oxide film are preferentially oriented in (0001) direction.

20. The method of manufacturing a piezoelectric stack according to claim 19, wherein in the deposition of the oxide film, the oxide film is deposited under a temperature condition of 200° C. or more, and in the deposition of the electrode film, the electrode film is deposited under a temperature condition of 200° C. or more.

* * * * *